(12) United States Patent
Barraclough et al.

(10) Patent No.: US 9,177,708 B2
(45) Date of Patent: Nov. 3, 2015

(54) ANNULAR COOLING FLUID PASSAGE FOR MAGNETS

(71) Applicant: Varian Semiconductor Equipment Associates, Inc., Gloucester, MA (US)

(72) Inventors: Scott Barraclough, Gloucester, MA (US); James S. Buff, Brookline, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/966,611

(22) Filed: Aug. 14, 2013

(65) Prior Publication Data

US 2014/0367583 A1 Dec. 18, 2014

Related U.S. Application Data

(60) Provisional application No. 61/835,089, filed on Jun. 14, 2013.

(51) Int. Cl.

| *H01J 1/50* | (2006.01) |
| *H01F 7/20* | (2006.01) |
| *H01J 37/147* | (2006.01) |
| *H01J 37/317* | (2006.01) |
| *H01F 27/10* | (2006.01) |

(52) U.S. Cl.
CPC .............. *H01F 7/20* (2013.01); *H01J 37/1475* (2013.01); *H01J 37/3171* (2013.01); *H01F 27/10* (2013.01); *H01J 2237/002* (2013.01); *H01J 2237/1526* (2013.01)

(58) Field of Classification Search
CPC ........................................................ H01F 6/04
USPC ................... 250/492.1, 492.2, 492.21, 492.3; 335/300; 336/55, 57, 58, 59, 60, 62
See application file for complete search history.

(56) References Cited

U.S. PATENT DOCUMENTS

| 4,883,968 | A | 11/1989 | Hipple et al. | |
| 6,588,725 | B1* | 7/2003 | Wisnieski et al. | ............. 251/123 |
| 2005/0248284 | A1 | 11/2005 | Burtner et al. | |
| 2007/0176123 | A1* | 8/2007 | Rubin et al. | ............. 250/492.21 |
| 2009/0084988 | A1 | 4/2009 | Blake et al. | |
| 2009/0206210 | A1* | 8/2009 | Qiao | ............................... 248/49 |
| 2010/0237725 | A1* | 9/2010 | Tatematsu et al. | ............. 310/61 |
| 2011/0126399 | A1 | 6/2011 | Smith et al. | |
| 2011/0308071 | A1 | 12/2011 | Baumann et al. | |
| 2013/0183174 | A1* | 7/2013 | Hampton | ................... 417/410.1 |
| 2014/0132380 | A1* | 5/2014 | Jacobson et al. | ................. 336/60 |

OTHER PUBLICATIONS

International Search Report and Written Opinion Mailed Nov. 10, 2014 for PCT/US2014/042321 Filed Jun. 13, 2014.

* cited by examiner

*Primary Examiner* — Jack Berman
*Assistant Examiner* — Jason McCormack

(57) ABSTRACT

A magnet having an annular coolant fluid passage is generally described. Various examples provide a magnet including a first magnet and a second magnet disposed around an ion beam coupler with an aperture there through. Each of the first and second magnets including a metal core having a cavity therein, one or more conductive wire wraps disposed around the metal core, and an annular core element configured to be inserted into the cavity, wherein an annular coolant fluid passage is formed between the cavity and the annular core element. Furthermore, each annular core element may have a first diameter and a middle section having a second diameter, the second diameter being less than the first diameter. Other embodiments are disclosed and claimed.

11 Claims, 6 Drawing Sheets

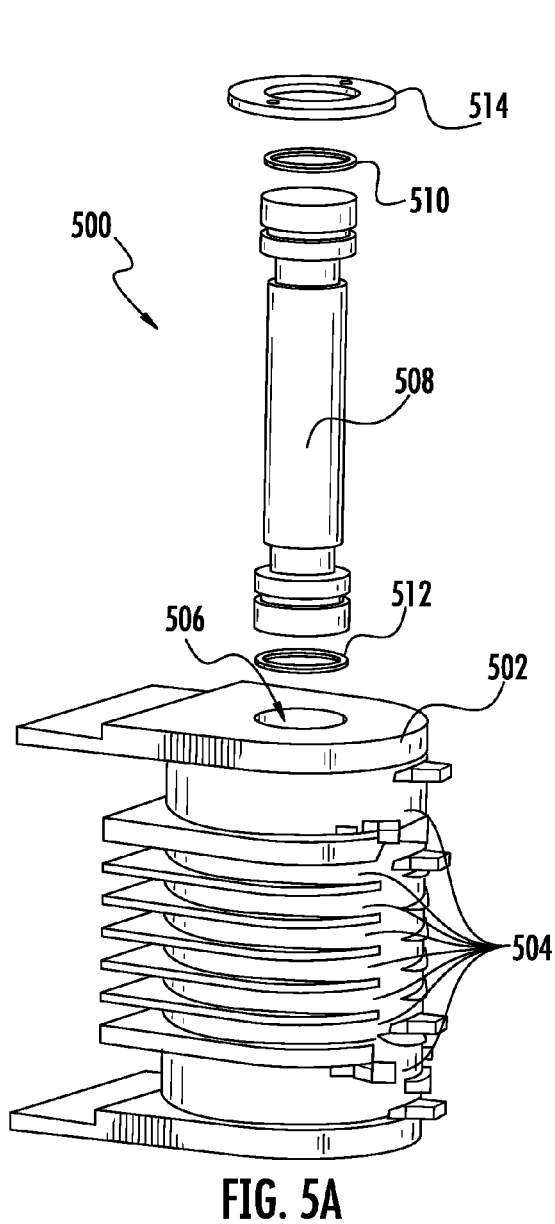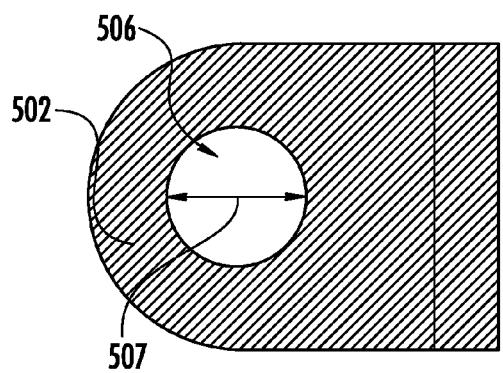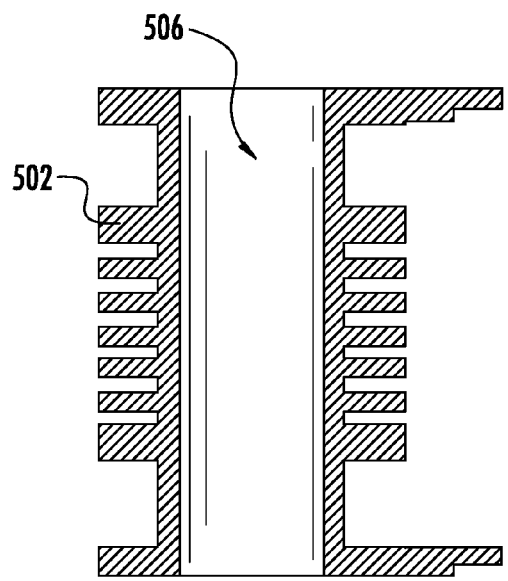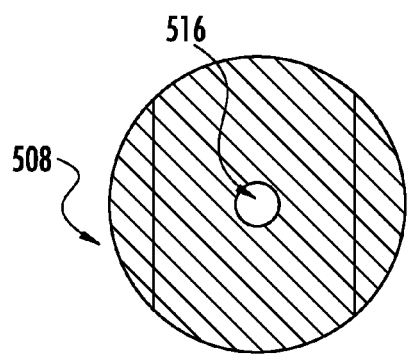
FIG. 5A
FIG. 5B
FIG. 5C
FIG. 5D

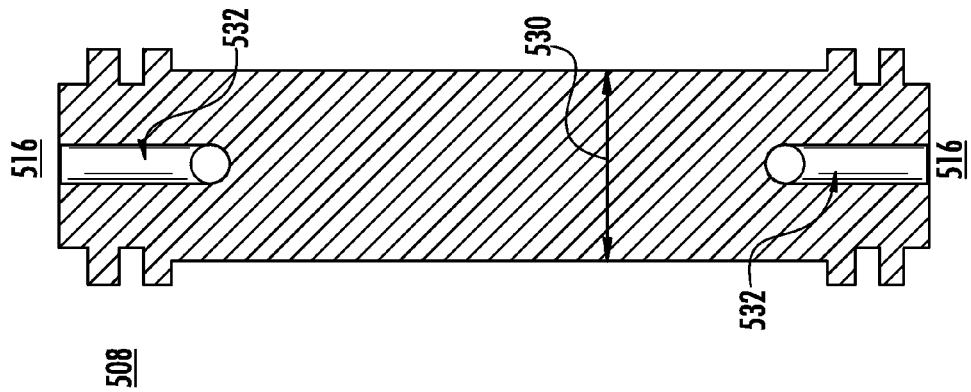
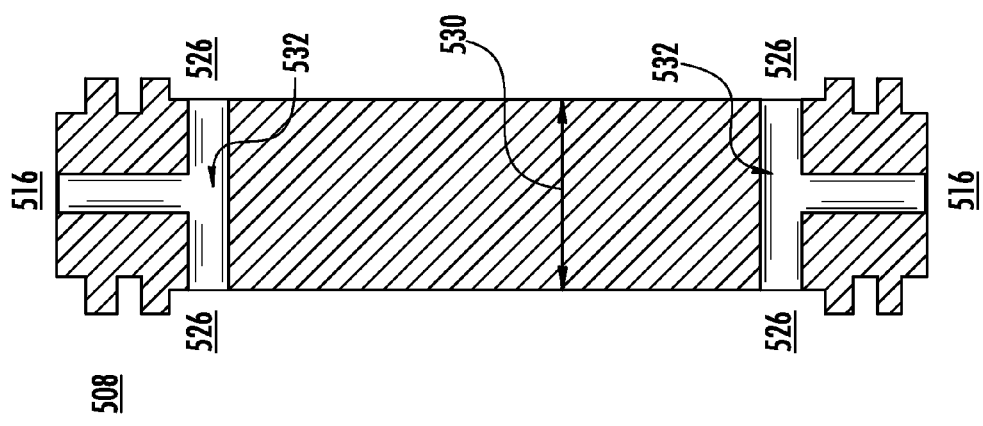
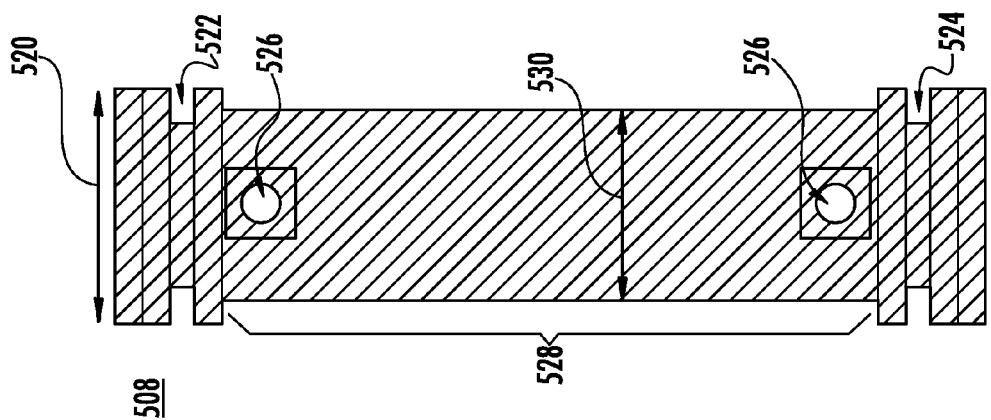

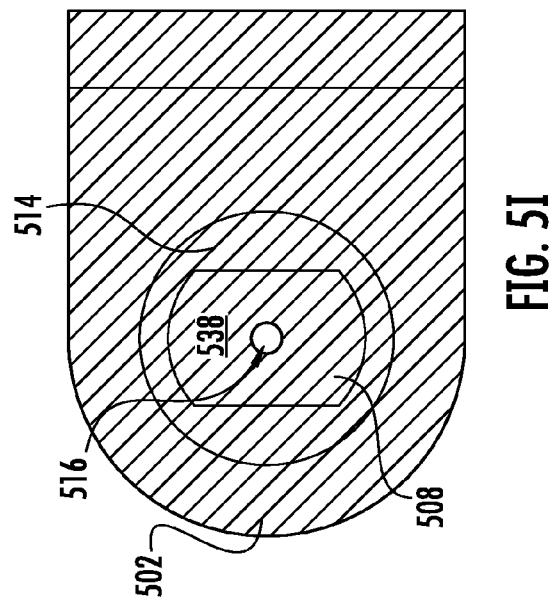
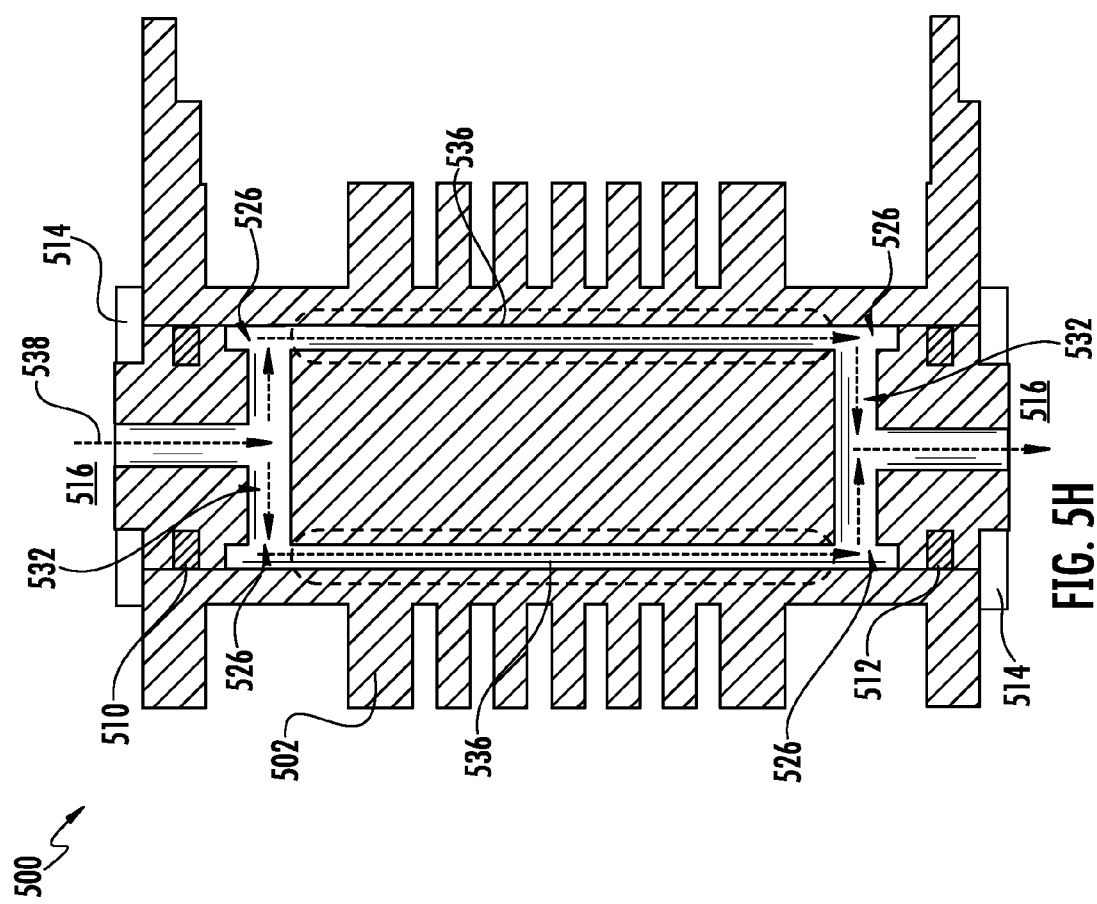

ANNULAR COOLING FLUID PASSAGE FOR MAGNETS

CROSS-REFERENCE TO RELATED APPLICATIONS

This is a non-provisional of pending U.S. provisional patent application Ser. No. 61/835,089, filed Jun. 14, 2013, the entirety of which application is incorporated by reference herein.

FIELD OF THE DISCLOSURE

Embodiments of the present disclosure generally relate to the field of substrate processing, and more particularly to the cooling of magnets used in conjunction with substrate processing for manufacturing semiconductor devices.

BACKGROUND OF THE DISCLOSURE

Ions are often used during manufacturing of semiconductor devices. For example, ions may be implanted into a substrate to dope the substrate with various impurities. Ions may be deposited onto a substrate to build up features on the substrate. Ions may also be used to etch away material during the manufacturing process. In general, ions are emitted from an ion source chamber. Magnets are often used to filter the ions and also shape the ions into an ion beam having desired characteristics and direct the ion beam at the substrate. Some of these magnets are formed by wrapping conductive wire around a metal core. Current is then passed through the conductive wire to create a magnetic field. During operation, the magnets often require cooling in order to operate at the required power levels necessary to create magnetic fields having desired characteristics. As such, a cooling passage is formed in the metal core through which cooling fluid is passed during operation. One deficiency in some current designs is that they may use a cooling passage at the centerline of the core. As such, heat generated in the windings must be conducted through the thickness of the core in order to reach the cooling fluid. The removal of a substantial amount of material in order to form a cooling passage of requisite size, as will be appreciated, reduces the amount of material in the metal core and undesirably reduces the strength and effectiveness of the magnetic field created by the magnet. Thus, there is a need for an improved cooling arrangement for magnets used in substrate processing operations.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a magnet comprising a metal core having a cavity therein, one or more conductive wire wraps disposed around the metal core, and an annular core element configured to be inserted into the cavity, wherein an annular coolant fluid passage is formed between the cavity and the annular core element. Furthermore, the annular core element may have a first diameter and a middle section having a second diameter, the second diameter being less than the first diameter.

As an alternative example, some embodiments disclose a magnet for use with an ion implant apparatus comprising an ion beam coupler having an aperture disposed there through, a first magnet disposed adjacent to the ion beam coupler, and a second magnet disposed adjacent to the ion beam coupler and the first magnet. Each of the first and second magnets can include a metal core having a cavity therein, one or more conductive wire wraps disposed around the metal core, and an annular core element configured to be inserted into the cavity. An annular coolant fluid passage may be formed between the cavity and the annular core element. Furthermore, each annular core element may have a first diameter and a middle section having a second diameter, where the second diameter is less than the first diameter.

Another example embodiment discloses an apparatus comprising an ion source configured to emit an ion beam, and a magnet positioned downstream of the ion source in a direction of travel of the ion beam, the magnet configured to shape the ion beam. The magnet may have an annular coolant fluid passage defined therein. A coolant fluid reservoir containing a coolant fluid may be connected to the annular coolant fluid passage. A coolant fluid pump may be connected to the coolant fluid reservoir, and may be configured to pump the coolant fluid through the annular coolant fluid passage. The magnet may include a first magnet disposed adjacent to an ion beam coupler and a second magnet disposed adjacent to the ion beam coupler and the first magnet. Each of the first and second magnets may include a metal core having a cavity therein, one or more conductive wire wraps disposed around the metal core, and an annular core element configured to be inserted into the cavity. An annular coolant fluid passage may be formed between the cavity and the annular core element. Furthermore, each annular core element may have a first diameter and a middle section having a second diameter, where the second diameter is less than the first diameter.

BRIEF DESCRIPTION OF THE DRAWINGS

By way of example, various embodiments of the disclosed device will now be described, with reference to the accompanying drawings, in which:

FIGS. 5A-5I are block diagrams of an annular coolant fluid passage through a magnet, all arranged in accordance with embodiments of the present disclosure.

DETAILED DESCRIPTION

The disclosed magnets and methods of cooling magnets are described in connection with a general ion implant apparatus and a quadrupole magnet. As will be appreciated, however, various embodiments of the present disclosure may be applied to other magnets of an ion apparatus. For example, various embodiments of the present disclosure may be used in an ion deposition apparatus, such as, a plasma-ion deposition apparatus. As another example, various embodiments of the present disclosure may be used in an ion etching apparatus. Furthermore, as described above, various embodiments of the present disclosure provide an annular cooling passage through a metal core of a magnet. Illustrative examples of annular coolant fluid passages are described in greater detail below, particularly with reference to FIGS. 5A-5H. Overall systems and illustrative configurations of the magnets having such annular cooling passages are described first with reference to FIG. 1 and FIGS. 2A-2B. Additionally, illustrative examples of coolant fluid flow paths through an example magnet are described with reference to FIGS. 3-4.

Figure 1:
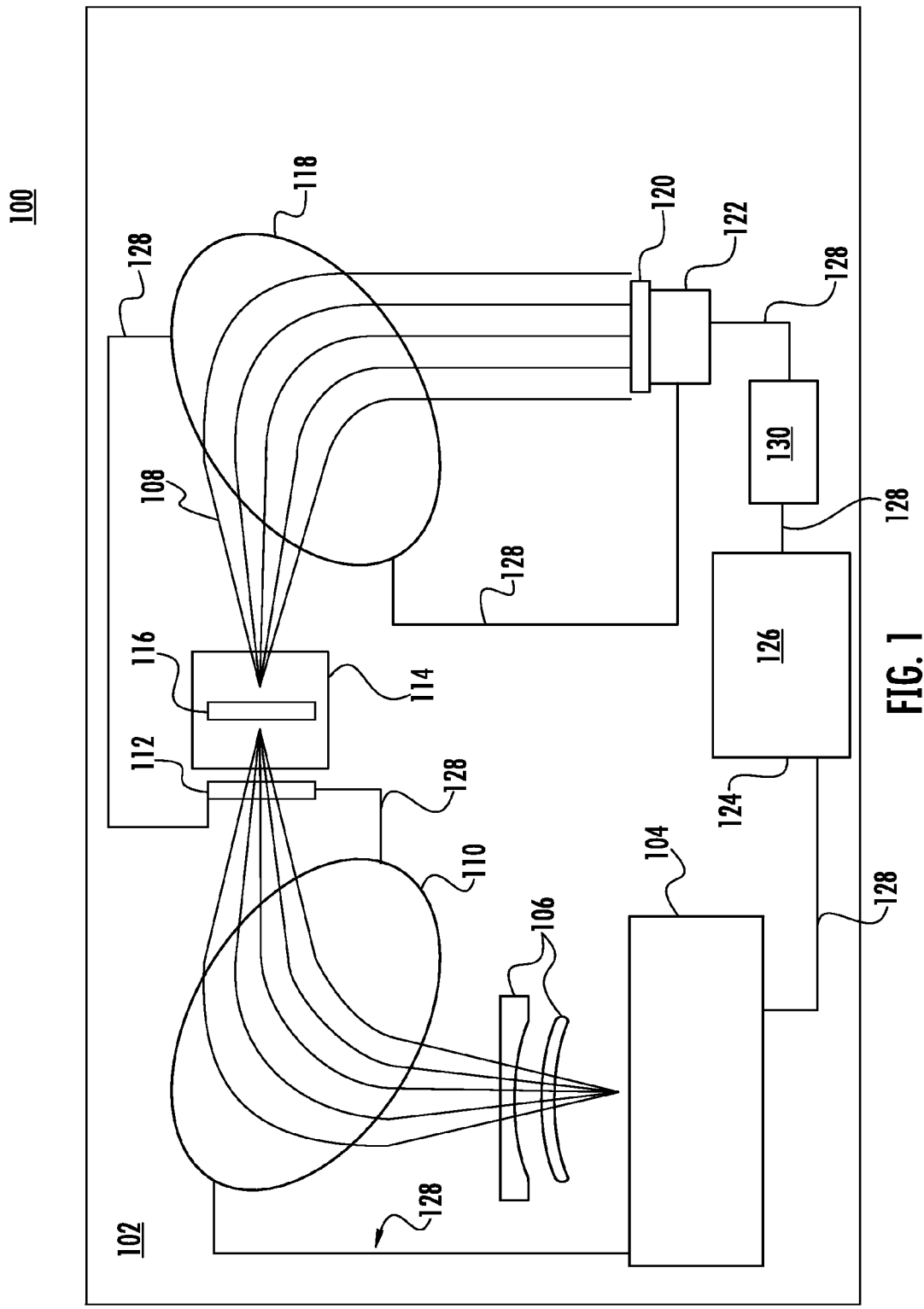
FIG. 1 is a block diagram of an exemplary ion implant apparatus.

FIG. 1 illustrates a block diagram of an example ion implant apparatus 100, arranged in accordance with at least some embodiments of the present disclosure that generate a ribbon beam. Other ion implant apparatus may generate a scanned spot beam having diverging trajectories that are then deflected to be substantially parallel before striking a workpiece. In general, some or all of the components of the ion implant apparatus 100 may be enclosed in a process chamber 102. As depicted, the ion implant apparatus 100 includes an ion source 104 configured to generate ions of a particular species. The ion source 104 may include a heated filament which ionizes a feed gas introduced into the process chamber 102 to form charged ions and electrons (plasma). The heating element may be, for example, a Bernas source filament, an indirectly heated cathode (IHC) assembly or other thermal electron source. Different feed gases may be supplied to the ion source chamber to obtain ion beams having particular dopant characteristics. For example, the introduction of $H_2$, $BF_3$ and $AsH_3$ at relatively high chamber temperatures are broken down into mono-atoms having high implant energies. High implant energies are usually associated with values greater than 20 keV. For low-energy ion implantation, heavier charged molecules such as decaborane, carborane, etc., may be introduced into the source chamber at a lower chamber temperature, which preserves the molecular structure of the ionized molecules having lower implant energies. Low implant energies typically have values below 20 keV.

The generated ions are extracted from the source through a series of electrodes 106 and formed into an ion beam 108, which passes through a first magnet 110. In some examples, the first magnet 110 may be a mass analyzer magnet configured with a particular magnetic field such that only the ions with a desired mass-to-charge ratio are able to travel through the analyzer for maximum transmission through a quadrupole magnet 112. The quadrupole magnet 112 may comprise a metal core wound with conductive wire configured to shape the ion beam 108 to have specific dimensions.

Upon exiting the quadrupole magnet 112, the ion beam 108 may pass through a mass resolving slit and onto a deceleration stage 114. The deceleration stage 114 may comprise multiple electrodes 116 with defined apertures that allow ion beams having specific characteristics to pass there through. By applying different combinations of voltage potentials to the electrodes 116, the deceleration stage 114 manipulates the ion energies in the ion beam 108.

A corrector magnet 118 may be disposed downstream of the deceleration stage 114. The corrector magnet 118 may be configured to deflect ion beamlets in accordance with the strength and direction of the applied magnetic field to provide a ribbon beam targeted toward a substrate 120, which may be positioned on a platen 122 (i.e., support structure). As will be appreciated, the corrector magnet 118 "shapes" the ion beam 108 after it leaves the deceleration stage 114 into the correct form for deposition onto the substrate 120. In addition, the corrector magnet 118 may be configured to filter out any ions from the ion beam 108 that may have been neutralized while traveling through the beam line.

During operation, the magnets and other components of the ion implant apparatus may require cooling. For example, the ion source 104, the first magnet 110, the quadrupole magnet 112, the corrector magnet 118, or the platen 122 may require cooling. As a particular example, the quadrupole magnet 112 may in some instances be configured to draw over 50 Amps of current. The amount of current flowing through the conductive wire of the quadrupole magnet may therefore cause an excess amount of heat to be generated. As a result, coolant fluid may be passed through the quadrupole magnet 112 in order to draw the generated heat away from the quadrupole magnet 112.

As such, the ion implant apparatus 100 may include a coolant reservoir 124 configured to hold coolant fluid 126 and a corresponding coolant path 128. A coolant pump 130 for circulating coolant fluid 126 through the coolant path 128 may also be included in the ion implant apparatus 100. The coolant pump 130 can be a centrifugal pump, a positive displacement pump, or any other type of pump appropriate to provide a desired flow rate and coolant pressure for circulating coolant fluid 126 through the coolant path 128. As depicted, the coolant path 128 passes through various components of the ion implant apparatus 100. Accordingly, during operation, coolant fluid 126 may be pumped through the components by the coolant pump 130 in order to cool the components. In some examples, the coolant fluid 126 may be water, water with glycol, galdin, flourinert, or another fluid having desirable heat absorption and dielectric properties.

As the coolant path 128 passes through various component of the ion implant apparatus 100 (e.g., the quadrupole magnet 112,) a coolant passage may exist in the various components. An annular coolant fluid passage (described in greater detail below) may exist in at least one of the components. Accordingly, as coolant is passed through the component during operation heat from the components may be transferred to the coolant and carried away from the components along the coolant path 128. In some examples, a heat exchanger and/or chiller (not shown) may also be provided to cool the coolant fluid 126. For example, the coolant fluid reservoir may be a combined reservoir and heat exchanger. It will be appreciated that the illustrated arrangement is merely exemplary, and that the particular coolant path 128, arrangement of the coolant reservoir 124, and arrangement of the coolant pump 130 can be modified from the illustrated approach as desired for a specific application. Further, it will be appreciated that multiple coolant paths, coolant pumps, and/or coolant reservoirs can also be provided, as desired. For example, although the illustrated system shows a closed loop recirculating cooling system, a "once-through" system could also be used.

Figure 2A:
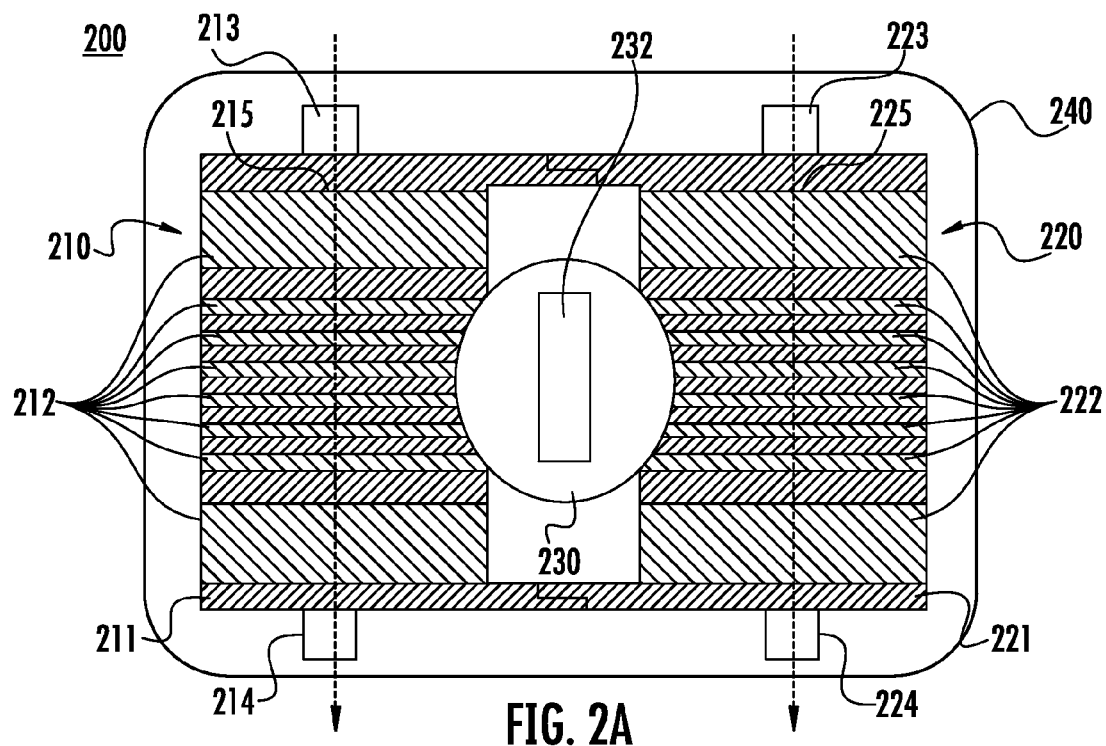
FIGS. 2A-2B are block diagrams of an exemplary quadrupole magnet.

FIG. 2A illustrates an exemplary quadrupole magnet 200, arranged according to various embodiments of the present disclosure. In some examples, the quadrupole magnet 200 may correspond to the quadrupole magnet 112 shown in FIG. 1. As depicted, the quadrupole magnet 200 includes a first magnet 210 and a second magnet 220 disposed around an ion beam coupling 230 having an aperture 232. In general, during operation, the ion beam 108 passes through the aperture 232 and the magnetic field created by the first magnet 210 and the second magnet 220 shapes the ion beam 108 to have specific properties (e.g., desired height and/or width).

The first and second magnets 210, 220 include metal cores 211, 221, wrapped by conductive wire, forming conductive wire wraps 212, 222. It is to be appreciated, that the number of conductive wire wraps 212, 222 are shown for illustrative purposes only and are not intended to be limiting. Furthermore, the quadrupole magnet 200 may be configured to have either a quadrupole or a dipole function depending upon the polarity of voltage applied to the conductive wire wraps 212, 222. The geometry of the metal cores 211, 221 and positioning of the conductive wire wraps 212, 222 may also be adjusted to achieve a magnetic field having a desired shape and strength.

The first and second magnets 210, 220 are disposed inside a housing 240. The housing 240 can be configured to hold the first and second magnets 210, 220 in a desired position with respect to the ion beam coupling 230 and to enable the quadrupole magnet 200 to be mounted within the ion implant apparatus 100.

The first and second magnets 210, 220 can further include coolant fluid couplings 213, 223, 214, 224. In general, the coolant fluid couplings 213, 223, 214, 224 are configured to facilitate passage of coolant fluid 126 through the metal cores 211, 221. As previously noted, during operation of the quadrupole magnet 220, as current is passed through the conductive wire wraps 212, 222, the conductive wire wraps will heat up. If the heat is not dissipated (e.g., by passage of coolant fluid through the metal cores 211, 221) then the quadrupole magnet 200 may shut down, melt, or otherwise malfunction. Coolant fluid couplings 213, 223, 214, 224 are shown for directing coolant fluid 126 through the metal cores 211, 221 along respective coolant flow paths 215, 225. As will be described in greater detail below, the coolant flow paths 215, 225 illustrated in these figures are representational, and may correspond to annular coolant fluid passages within the metal cores 211, 221, as will be described in greater detail in relation to FIGS. 5A-5I.

Figure 2B:
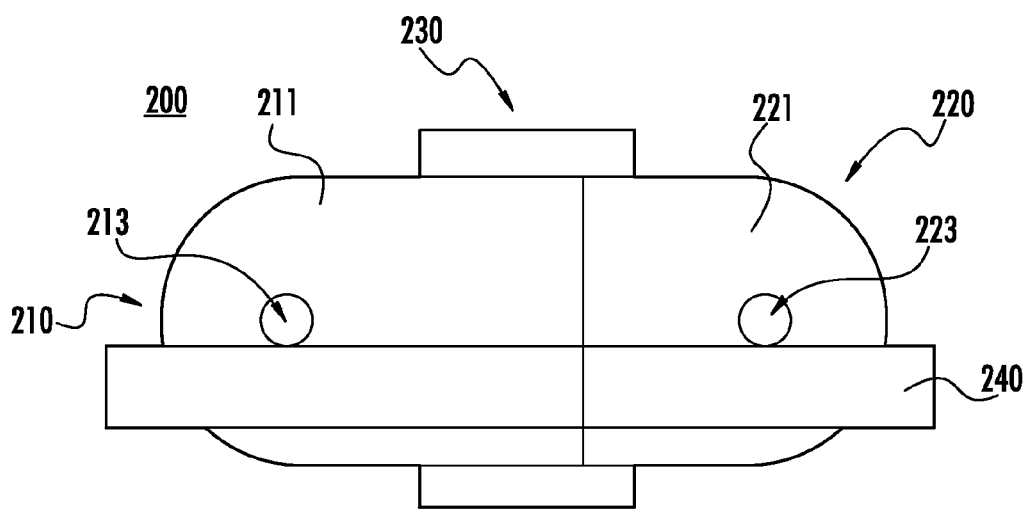

FIG. 2B is a top view of the quadrupole magnet 200 shown in FIG. 2A. As depicted, the first and second magnets 210, 220 are shown disposed around the ion beam coupling 230. The housing 240 is shown disposed about the first and second magnets 210, 220. Furthermore, coolant fluid couplings 213, 223 are also shown, associated with the first and second magnets 210, 220, respectively.

With some examples, the metal cores 211, 221 may be formed from a steel alloy, such as, low carbon steel, or other metal having properties suitable for the core of a magnet. The conductive wire wraps 212, 222 may be formed from a conductive wire, such as, copper. Furthermore, with some embodiments, the metal cores 211, 221 and the conductive wire wraps 212, 222 may be encased in an epoxy or other suitable dielectric material.

Figure 3:
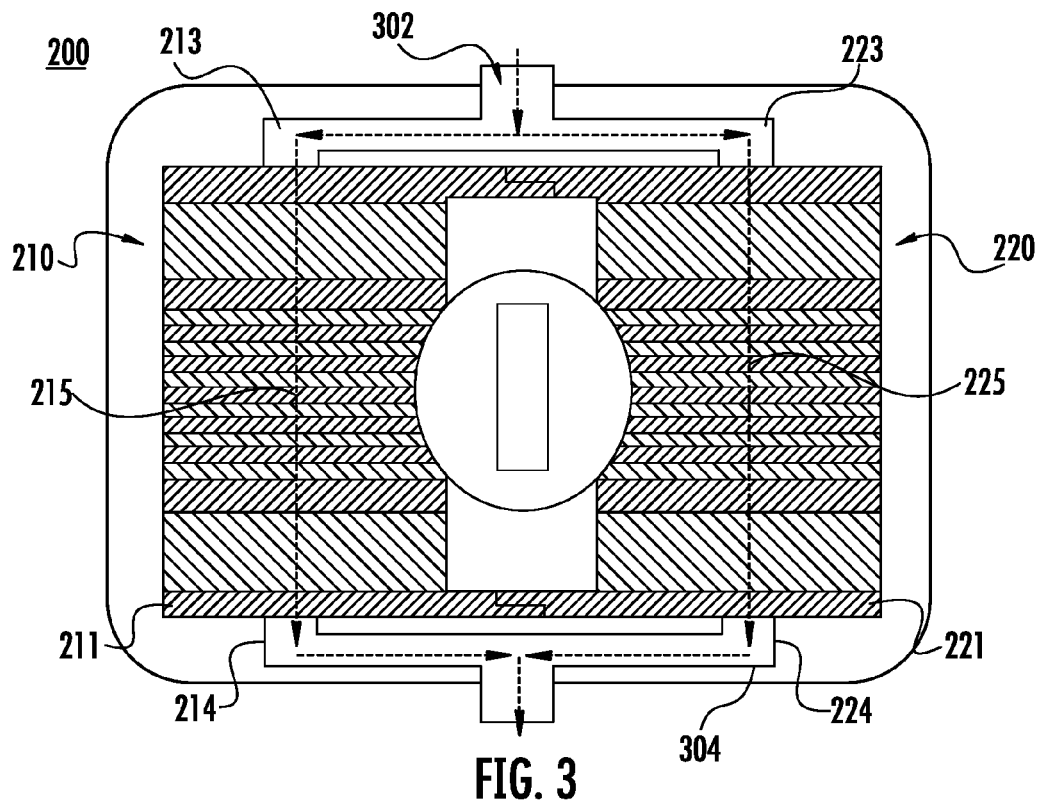
FIG. 3 is a block diagram of an exemplary coolant fluid flow path through the quadrupole magnet of FIGS. 2A-2B.

In some examples, the coolant flow paths 215, 225 may be configured in a parallel manner. For example, FIG. 3 illustrates the quadrupole magnet 200 having the coolant flow paths 215, 225 arranged in a parallel manner. As depicted, the quadrupole magnet 200 includes an inlet tee 302 that connects to the coolant fluid couplings 213, 223 and an outlet tee that connects the coolant fluid couplings 214, 224. Coolant fluid 126 may enter through inlet tee 302, where the coolant fluid is directed along both coolant flow paths 215, 225 simultaneously. Coolant fluid 126 flows through the metal cores 211, 221 and exits through outlet tee 304. It will be appreciated that such an arrangement of coolant flow ensures that the first and second magnets 210, 220 are subjected to coolant fluid 126 at substantially the same temperature, thus resulting is substantially even cooling of the first and second magnets.

Figure 4:
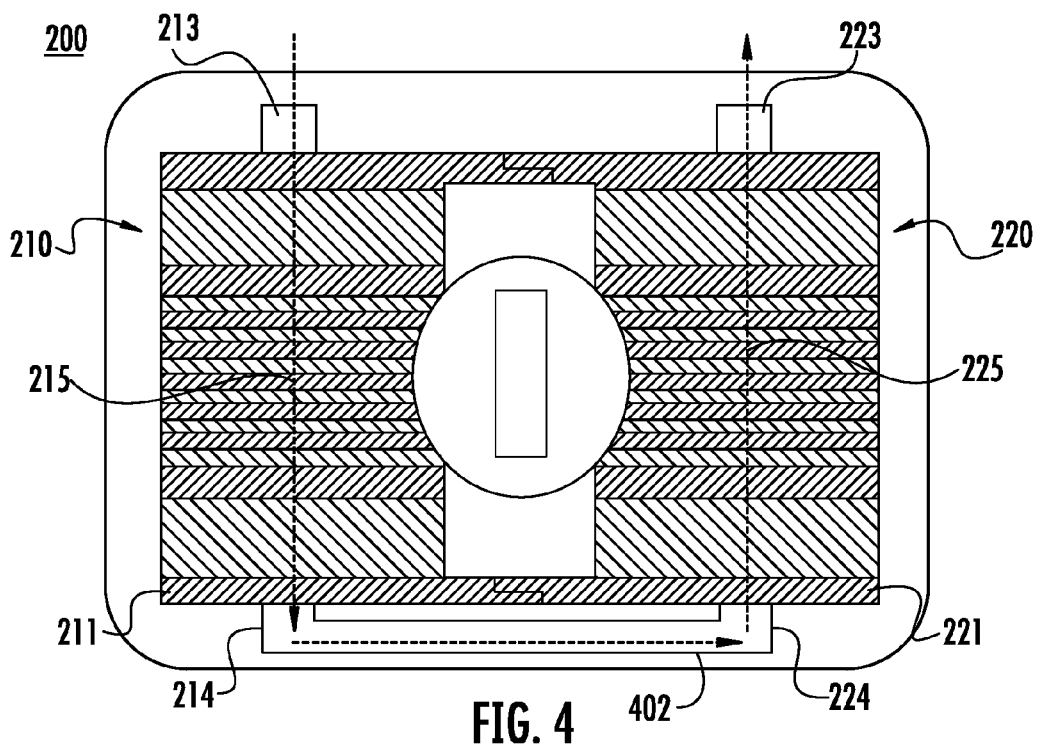
FIG. 4 is a block diagram of another exemplary coolant fluid flow path through the quadrupole magnet of FIGS. 2A-2B.

In some examples, the coolant flow paths 215, 225 may be configured in a series manner. For example, FIG. 4 illustrates the quadrupole magnet 200. As depicted, the quadrupole magnet 200 includes a return pipe 402 that connects the coolant fluid couplings 214, 224. Accordingly, during operation, coolant fluid 126 may be passed through metal cores 211, 221 along coolant flow paths 215, 225 in a series manner. That is, coolant fluid 126 may enter metal core 211 of the first magnet 210 via coolant fluid coupling 213, may pass through the metal core 211 along the coolant passage 215, and may exit the metal core 211 via coolant fluid coupling 214. Coolant fluid may then pass through the return pipe 402 to coolant fluid coupling 224, may enter the metal core 221 of the second magnet 220 at coolant fluid coupling 224, may pass through the metal core 221 along coolant flow path 225, and may exit the metal core 221 through coolant fluid coupling 223. This arrangement may be slightly less complex to implement as compared to the parallel flow arrangement described in relation to FIG. 3. It will be appreciated that with the FIG. 4 arrangement, the coolant fluid 126 may have a slightly higher temperature when it passes through the second metal core 221 as compared to when it passes through the first metal core 211 (owing to the heat transferred away from the first metal core). Thus, overall cooling of the second metal core 221 may be slightly less than the overall cooling of the first metal core 211. This, of course, could be compensated for by providing flow channels in the second metal core 221 that are larger, or have different geometry, as compared to those of the first metal core 211.

FIG. 5A is an exploded view of a magnet 500 (minus the conductive metal wraps, for clarity) arranged according to various embodiments of the present disclosure. As depicted, the magnet 500 may correspond to either the first magnet 210 and/or the second magnet 220 of the quadrupole magnet 200 described in relation to the previous figures. The magnet 500 includes a metal core 502, having conductive wire wrapped around the metal core 502, forming conductive wire wraps 504. The metal core 502 has material removed from it, forming a cavity 506 running from a top of the metal core to a bottom of the metal core. The magnet 500 also includes an annular core element 508, which is configured to fit within the cavity 506. Upper and lower o-rings 510, 512 as well as end caps 514 are also shown (only one end cap can be seen in this view). As depicted, the upper and lower o-rings 510, 512 may fit within corresponding circumferential grooves in the annular core element 508, which may be inserted into the cavity 506 and secured with an end caps 514 (see FIG. 5H).

FIG. 5B is a top view of the metal core 502 alone, showing the cavity 506. The cavity 506 may have a cavity diameter 507 sized to receive the annular core element 508. As will be appreciated, the top view of the metal core 502 shown in FIG. 5B may also correspond to the bottom view (not shown) of the metal core 502. FIG. 5C illustrates a cross-section view of the metal core 502. The cross-section view of the metal core 502 is shown with the cut along the length of the cavity 506. As can be seen from these figures, the cavity 506 extends along the entire length of the metal core 502.

FIG. 5D illustrates a top view of the annular core element 508. As will be appreciated, the top view of the annular core element 508 shown in FIG. 5D may also correspond to the bottom view (not shown) of the annular core element 508. As can be seen, an external coolant fluid opening 516 is centrally disposed in the top end of the annular core element 508 for admitting coolant fluid 126 into the annular core element. A similar opening is provided in the bottom end of annular core element 508 (used as an outlet for coolant fluid 526) as can be seen in FIG. 5H. FIG. 5E illustrates a side view of the annular core element 508. The annular core element 508 is shown having a first diameter 520 associated with a top end of the annular core element. As depicted, the annular core element 508 also includes upper and lower circumferential o-ring receiving recesses 522, 524 as well as internal coolant fluid openings 526. The internal coolant fluid openings 526 are coupled to the external coolant fluid openings 516 positioned at the top and bottom of the annular core element 598, and can be employed to direct coolant fluid 126 to and from an annulus formed between the metal core 502 and the annular core element 508, as will be described in greater detail later. The annular core element 508 may includes a middle section 528 having a second diameter 530 that is smaller than the first diameter 520. The first diameter 520 may be slightly smaller than the cavity diameter 507 of the metal core 502 (see FIG. 5I) so that the annular core element 508 can be slid into engagement with the cavity 506 of the metal core. As will be appreciated, the difference in diameters between the middle section 528 of the annular core element 508 and the metal core 502 creates an annular coolant fluid passage 538 (best seen in FIG. 5H) that can be used to effectively cool the metal core during operation.

FIG. 5F is a cross-section view of the annular core element 508. The cut away view depicted in FIG. 5F is shown with the cut along the length of the annular core element and parallel to the internal coolant fluid holes 526. As can be seen, the annular core element 508 includes internal coolant passages 532 formed between the external coolant fluid openings 516 and the internal coolant fluid openings 526. FIG. 5G illustrates another cross-section view of the annular core element 508. The cross-section view depicted in FIG. 5G is shown rotated 90-degrees with respect to the view depicted in FIG. 5F.

FIG. 5H is a cross-section view of the metal core 502 with the annular core element 508 disposed within the cavity 506. As can be seen, the annular core element 508 is secured to the metal core 502 with end caps 514, and is fluidically sealed to the metal core via upper and lower o-rings 510, 512 disposed in the upper and lower circumferential o-ring receiving recesses 522, 524. External coolant fluid openings 516 and internal coolant fluid openings 526 are also shown. In some examples, the external coolant fluid openings 516 may be configured (e.g., threaded, tapered, or the like) to receive one of the previously described coolant fluid couplings 213, 223, 214, or 224. As such, the annular core element 508 may be fluidly connected to coolant fluid lines (e.g., the coolant fluid path 128 shown in FIG. 1). FIG. 5I illustrates a top view of the metal core 502 having the annular core 508 disposed thereon and secured with one of the end caps 514 such that one of the external coolant fluid opening 516 is exposed.

An exemplary coolant fluid flow path (represented by dotted arrow 538) through the annular coolant fluid passage 536 is shown. In some examples, the coolant fluid flow path 538 may generally correspond to either of coolant paths 215 or 225 shown in FIGS. 2A-2B and FIGS. 3-4. During operation, coolant fluid 126 may be pumped into one of the external coolant fluid openings 516 (at the top of the magnet, in the illustrated embodiment). The coolant fluid 126 may then pass through the corresponding internal coolant passages 532, out the corresponding internal coolant openings 526, and into the annular coolant fluid passage 536. As can be seen, the annular coolant fluid passage 536 is disposed adjacent the region of the metal core 502 that includes the conductive wire wraps (not shown in this view, for clarity), and thus most of the heat transfer from the magnet 500 to the coolant fluid 126 occurs as the coolant fluid navigates the annular coolant fluid passage 536. Heated coolant fluid 126 may then pass into the internal coolant openings 526 in the lower portion of the annular core element 508, through the corresponding internal coolant passages 532 and out the external coolant fluid opening 516 (at the bottom of the magnet in the illustrated embodiment). It will be appreciated that coolant fluid flow needn't be from top to bottom, but instead could be arranged to flow from the bottom of the magnet to the top.

In some embodiments, effective cooling of the magnet 500 is accomplished when the coolant fluid 126 is perturbed into the turbulent flow regime within the annular coolant fluid passage 536. As will be appreciated, this coolant fluid passage 536 allows the coolant fluid 126 to be close to the heat source (i.e., the conductive wire wraps) and still have the necessary core steel to maintain desired magnetic field performance. This is an advantage over standard cooling arrangements that include a single cylindrical passage through the metal core on the center line, which limits the overall heat transfer surface and places the coolant fluid a large distance from the heat source (i.e., the conductive wire wraps), and which limits cooling capacity by the conduction of the heat through the core.

In some examples, the first diameter 520 and the second diameter 530 may be selected such that a flow rate of between 0.25 gallons per minute and 3 gallons per minute are achieved when coolant fluid is 126 is passed through the annular coolant fluid passage 536. In some examples, the first diameter 520 and the second diameter 530 may be selected such that coolant fluid 126 having a temperature of between 15 and 30 degrees Celsius, enters the coolant fluid passage 536, absorbs heat from the metal core 502 and the annular core 508, and then exists the coolant fluid passage 536 with an elevated temperature of between 26 and 42 degrees Celsius.

As will be appreciated the annular coolant fluid passage 536 may be circular in shape. More specifically, the annular coolant fluid passage 536 may correspond to the space formed between the middle section 528 of the annular core element 508 and the cavity diameter 507 of the metal core 502, as described in relation to FIG. 5B.

It is to be appreciated, that the dimensions of the annular core element 508, and particularly the first diameter 520 and the second diameter 530, may be selected such that the coolant fluid flow rate through the annular coolant fluid passage 536, and the heat transfer parameters, allow for a desired level of heat dissipation from the metal core 502. As an illustrative example, the first diameter 520 may be 1.25 inches while the second diameter 530 may be 1.20 inches. Such an arrangement would result in an annular coolant fluid passage 536 having a radial width (i.e., distance between the outer surface of the annular core element 508 and inner surface of the metal core 502) of about 0.025 inches. As another illustrative example, the first diameter 520 may be 1.25 inches while the second diameter 530 may be 1.00 inches. Such an arrangement would result in an annular coolant fluid passage 536 having a radial width (i.e., distance between the outer surface of the annular core element 508 and inner surface of the metal core 502) of about 0.125 inches. With some examples, the ratio of the first diameter 520 to the second diameter 530 may be determined based on balancing the amount of coolant flow through the annular coolant fluid passage 536 and removing as little material from the middle section 528 as possible. For example, the scenario described above where the first diameter 520 is 1.25 inches and the second diameter 530 is 1.20 inches may be preferable over the other scenario as less material is removed from the annular core 508 in the first scenario.

In some examples, the metal core 502 and the annular core element 508 may be formed from the same material (e.g., low carbon steel, or the like). Accordingly, the material available to form the magnetic field during operation of the magnet 500 (e.g., the combined material of the metal core 502 and the annular core element 508) may be substantially similar that of a solid metal core 502 (i.e., metal core without the cavity 506). As such, the characteristics of the magnetic field that may be formed by magnet 500 may be improved over prior devices, while still maintaining an ability to effectively cool the magnet 500. In some examples, the amount of current that may be passed through the conductive wire wraps 504 may be increased as compared to prior devices due to the substantial increase in cooling capacity of the disclosed magnet 500.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A magnet comprising:
a metal core having a cavity therein;
a plurality of conductive wire wraps disposed around the metal core to shape an ion beam produced by an ion source of an ion implant apparatus; and
an annular core element configured to be received within the cavity, the annular core element configured to form an annular coolant fluid passage between the cavity and the annular core element, wherein the annular core element has an external coolant fluid opening, an internal coolant fluid opening disposed in a middle section, and an internal coolant fluid passage connecting the external coolant fluid opening and the internal coolant fluid opening, and wherein the external coolant fluid opening is a first external coolant fluid opening and the internal coolant fluid opening is a first internal coolant fluid opening, and the annular core has a second external coolant fluid opening, a second internal coolant fluid opening disposed in the middle section, and a second internal coolant fluid passage connecting the second external coolant fluid opening and the second internal coolant fluid opening.

2. The magnet according to claim 1, wherein the annular core element has a first diameter and a middle section having a second diameter, the second diameter being less than the first diameter.

3. The magnet according to claim 1, wherein the annular core element includes a circumferential recess for receiving an o-ring.

4. The magnet according to claim 3, further comprising an o-ring disposed in the circumferential recess, the o-ring for fluidically sealing the annular core element to the metal core.

5. The magnet according to claim 4, further comprising an end cap for securing the annular core element to the metal core.

6. A magnet for use with an ion implant apparatus, the magnet comprising:
an ion beam coupling having an aperture disposed there through;
a first magnet disposed adjacent to the ion beam coupling; and
a second magnet disposed adjacent to the ion beam coupling and the first magnet, each of the first and second magnets including:
a metal core having a cavity therein;
a plurality of conductive wire wraps disposed around the metal core; and
an annular core element configured to be received within the cavity, the annular core element configured to form an annular coolant fluid passage between the metal core and the annular core element, wherein the annular core element has a first diameter and a middle section having a second diameter, the second diameter being less than the first diameter, wherein the annular core element has an external coolant fluid opening, an internal coolant fluid opening disposed in the middle section, and an internal coolant fluid passage connecting the external coolant fluid opening and the internal coolant fluid opening, and wherein the external coolant fluid opening is a first external coolant fluid opening and the internal coolant fluid opening is a first internal coolant fluid opening, and the annular core has a second external coolant fluid opening, a second internal coolant fluid opening disposed in the middle section, and a second internal coolant fluid passage connecting the second external coolant fluid opening and the second internal coolant fluid opening.

7. The magnet according to claim 6, wherein the magnet is a quadrupole magnet.

8. The magnet according to claim 6, further comprising a housing disposed around the first and second magnets.

9. The magnet according to claim 6, wherein the annular core element includes at least one circumferential recess for receiving an o-ring.

10. The magnet according to claim 9, further comprising an o-ring disposed in the circumferential recess.

11. The magnet according to claim 10, further comprising an end cap configured to secure the annular core element to the metal core.

* * * * *